United States Patent [19]
Englund

[11] Patent Number: 5,635,831
[45] Date of Patent: Jun. 3, 1997

[54] OPTICAL VOLTAGE AND ELECTRIC FIELD SENSOR BASED ON THE POCKELS EFFECT

[75] Inventor: Marja Englund, Espoo, Finland

[73] Assignee: Imatran Voima Oy, Helsinki, Finland

[21] Appl. No.: 583,843

[22] Filed: Jan. 11, 1996

Related U.S. Application Data

[63] Continuation of Ser. No. 244,181, filed as PCT/FI92/00326 Nov. 30, 1992, published as WO93/12435, Jun. 24, 1993 abandoned.

[30] Foreign Application Priority Data

Dec. 11, 1991 [FI] Finland ................ 915818

[51] Int. Cl.$^6$ .......................................... G01R 29/00
[52] U.S. Cl. .............................. 324/96; 324/117 R
[58] Field of Search ............................. 324/117 R, 96, 324/244.1; 250/227.01, 231.1, 227.14; 359/727, 248; 385/15, 13; 356/368, 400, 410

[56] References Cited

U.S. PATENT DOCUMENTS

| | | | |
|---|---|---|---|
| 4,631,402 | 12/1986 | Nagatsuma et al. | 324/96 |
| 4,812,767 | 3/1989 | Taketomi | 324/96 |
| 4,848,871 | 7/1989 | Seidel et al. | 385/13 |
| 4,956,607 | 9/1990 | Abe et al. | 324/96 |
| 4,968,881 | 11/1990 | Takahashi et al. | 324/96 |
| 4,978,910 | 12/1990 | Knox et al. | 324/96 |
| 4,999,570 | 3/1991 | Ehrler | 324/96 |
| 5,040,882 | 8/1991 | Markle | 359/727 |
| 5,055,770 | 10/1991 | Takahashi et al. | 324/96 |

*Primary Examiner*—Vinh P. Nguyen

[57] ABSTRACT

An optical voltage/electric field sensor includes a crystal having a refractive index distribution which depends on an electric field applied thereto, wires for leading the electric field onto the surface of the crystal, a detector to detect changes in the refractive index distribution, and a transparent material having a low extinction coefficient and dielectric constant surrounding the crystal. Such a sensor is particularly useful for measuring the voltage of high frequency dryers.

15 Claims, 4 Drawing Sheets

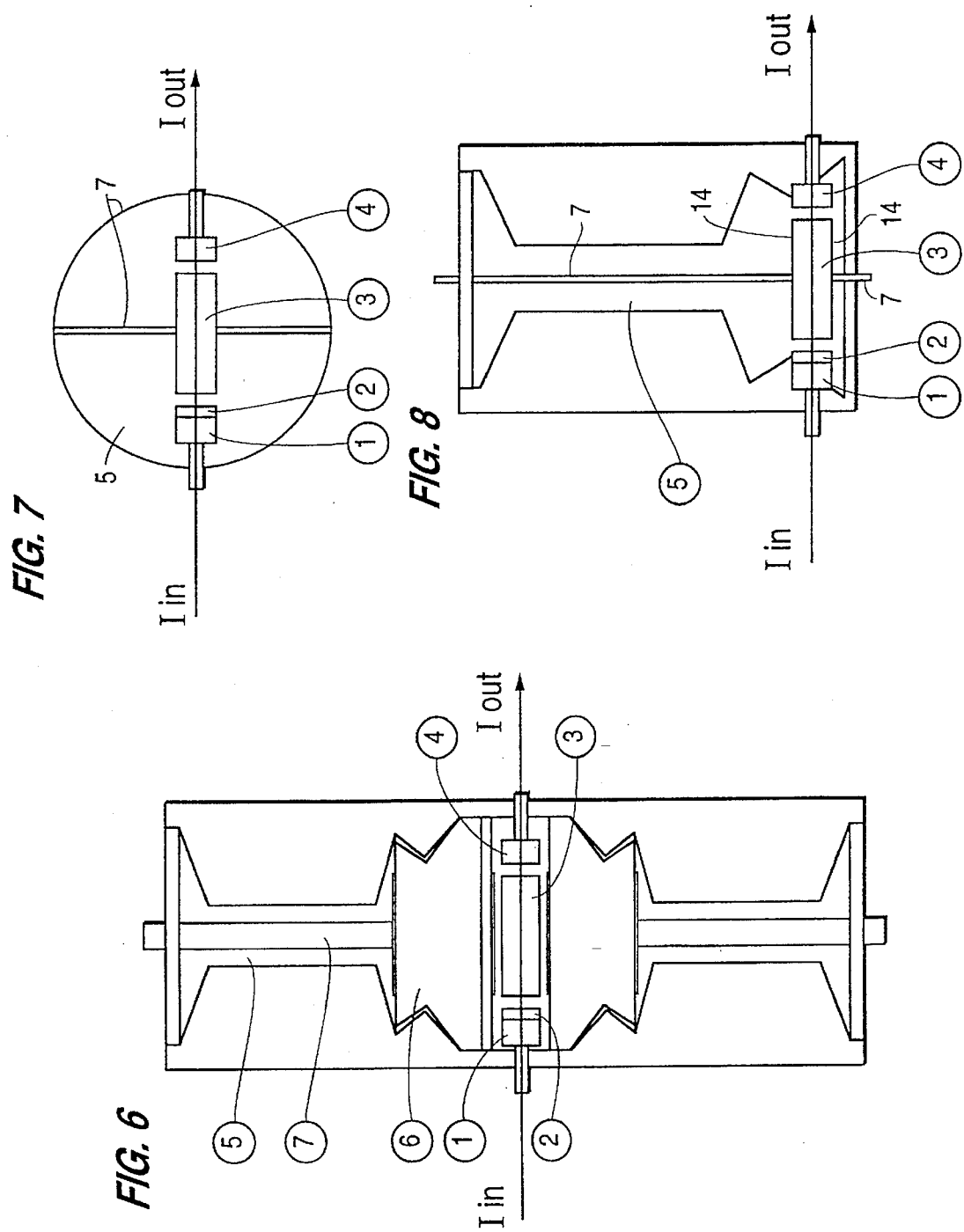

OPTICAL VOLTAGE AND ELECTRIC FIELD SENSOR BASED ON THE POCKELS EFFECT

This application is a continuation of application Ser. No. 08/244,181, filed as PCT/FI92/00326 Nov. 30, 1992, published as WO93/12435 Jun. 24, 1993 now abandoned.

The invention relates to an optical sensor for voltage and electric field based on the Pockels effect.

The function of the present voltage and electric field sensor is based on the electrooptical Pockels effect that is exhibited, e.g., by the following materials: $LiNbO_3$, $LiTaO_3$, KDP, ADP, and $Bi_4Ge_3O_{12}$. According to the Pockels effect, the plane of polarization of polarized light when the light is passed through such a material in the presence of an electric field. The Pockels effect is exhibited typically by crystalline materials that do not possess a center of symmetry.

Distribution of refractive index of the crystal used as the optical sensor is altered by the voltage being measured. The resultant difference in refractive index depends on the intensity of electric field. The difference in refractive index produces a phase difference between the mutually perpendicularly polarized components of the plane polarized light passed through the material. Depending on structure and orientation of the crystal, a longitudinal or a transverse effect occurs. In the longitudinal effect the path of the ray and the electric field are parallel, and in the transverse effect they are perpendicular to each other.

A measurement system based on the Pockels effect comprises typically an optical sensor, optical fibres, and an electronic unit that transmits infrared radiation modulated by the voltage or electric field being measured, through the fibres to the sensor. Information about voltage or electric field is obtained by means of measuring the intensity changes of the radiation returned by the sensor.

Optical voltage sensors based on the Pockels effect are developed for various high voltage measurements. Most of the embodiments are designed to function in the 50–60 Hz frequency range. A few demonstrations have been carried out to measure also rapid changes in voltage. Problems of the high frequency embodiments have been the high frequency high voltage endurance and the frequency range of the measurement system. For example, in the high frequency drying 13.56 MHz frequency and 10 kV voltage are used.

The aim of the present invention is to overcome the disadvantages of the prior art technology and to achieve an entirely new kind of optical sensor of voltage and electric field based on the Pockels effect.

The invention is based on filling the inner structure surrounding the crystal of the sensor with a transparent material that has a low extinction coefficient and dielectric constant, like silicone, so that air gaps in the sensor are avoided.

The invention provides outstanding benefits.

Silicone is easily attachable to surfaces of ceramical materials and optical components. Silicone protects from humidity, improves voltage endurance and increases the frequency response in the 300 Hz–30 Mhz range, damping the vibration of the crystal used in the sensor. Using silicone makes it feasible to improve sensitivity and dynamics of the sensor while not impairing its voltage endurance. Measurements have indicated that the voltage endurance was increased approximately five times by using silicone. At the same time the measurement range of the sensor was enlarged. The silicone used has such qualities (extinction coefficient tan$\delta$ is small) that it is not heated by an intensive high frequency field, thus making its use very suitable also in the optical sensors of high frequency dryers.

In the following, the invention will be examined in detail with help of the following exemplifying embodiments illustrated in the attached drawings.

FIG. 6 is a sectional side view of a second sensor in accordance with the invention.

FIG. 7 is a sectional side view of a sensor in accordance with the invention for measuring the electric field.

FIG. 8 is a sectional side view of a third sensor in accordance with the invention.

Figure 1:
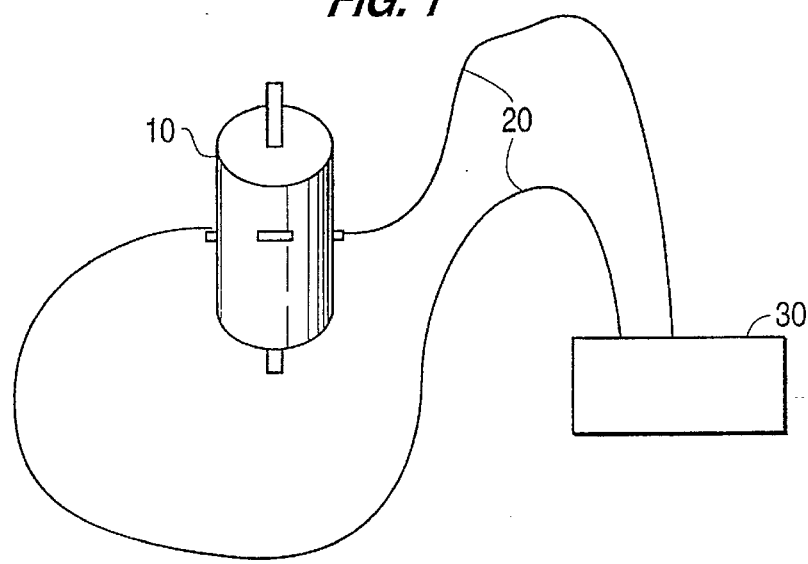
FIG. 1 is a schematic representation of a measurement system using a sensor in accordance with the invention.

The optical measurement system shown in FIG. 1 comprises optical sensor 10, optical fibres 20 and electronic unit 30 that transmits infrared radiation modulated by the voltage being measured, through the fibres 20 to the voltage sensor 10. Measuring the intensity changes of the radiation returned by the sensor 10, information about the voltage or electric field is obtained. Distortions of the measurement signal caused by the attenuation of the radiation level possibly occurring in the whole measurement system are compensated in the electronic unit 30.

The function of the optical voltage and electric field sensor is based on the electrooptical Pockels effect. In accordance with the effect, the plane of polarization of polarized light alters when the light is passed in the presence of an electric field through a material exhibiting the Pockels effect. A sensor utilizing such an active material can thus be used to measure high frequency voltage without applying electrical power on the sensor. The optical sensor is isolated from the voltage being measured by fibres, because galvanically connected sensor and measurement device would have a side effect on the measurement result. The optical sensor differs from other similar sensors functioning on the same principles by its speed (30 MHz), and particularly by its construction. The construction of the sensor 10 is illustrated in detail in FIGS. 4–9.

In the following, theory of the effect is described in detail.

In accordance with the Pockels effect, an electric field causes alteration in the refractive index of a material that is proportional to the electric field.

$$\Delta n = n_0^3 r_{y,k} E_k, \quad (1)$$

where $\Delta n$ = the difference in refractive index caused by the electric field, which difference is produced between two mutually perpendicularly polarized components of a light wave traversing the crystal, $n_0$ = the refractive index of the crystal without the presence of the electric field, $r_{i,j,k}$=the linear electro-optical coefficient, and the indexes i and j represent the planes of the electric field (of the polarization) of the optical wave, acquiring values 1, 2 and 3, and k (1, 2 or 3) indicates the direction of the electric field applied to the crystal and $E_k$=the electric field applied to the crystal.

Due to the symmetries of crystals the index pair (ij) can be replaced by six combinations (11)=1, (22)=2, (33)=3, (24)=4, (13)=5, and (12)=6, so that equation (1) can be written as $$\Delta n = n_0^3 r_{h,k} E_k, \; h=1,2,3,4,5 \text{ or } 6. \qquad (2)$$

Figure 4:
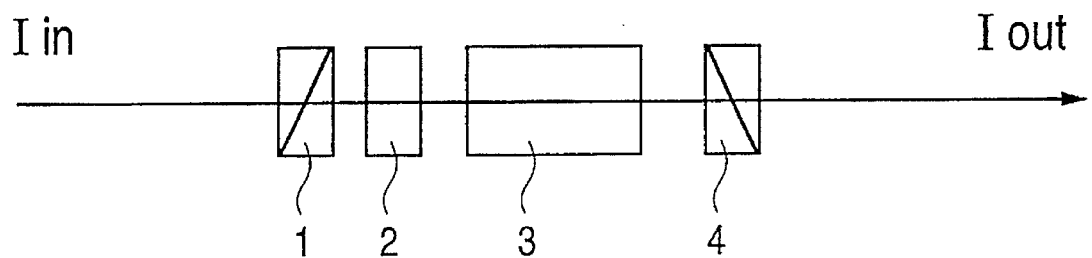
FIG. 4 is a side view of the basic components of the sensor in accordance with the invention.

Basic components of a typical sensor for measuring voltage and electric field utilizing the Pockels effect are shown in FIG. 4. Light passes via polarizer I and phase shift plate 2 through optical sensor element 3. The optical sensor element 3 exhibits the Pockels effect. A phase difference between the mutually perpendicularly polarized components of the plane polarized light is produced by the voltage being measured. The phase difference causes alteration in the plane of polarization of the light. The change in the plane of polarization is detected by the second polarizer 4 acting as an analyzer. The electric intensity perceived by the sensor element 3 determines the intensity of light passing through the analyzer 4. If the planes of polarization of polarizer 1 and analyzer 4 are perpendicular and the phase shift plate 2 gives a phase difference of 90°, the intensity of the emergent light is given by the expression $$P = P_0/2(1 - \pi/V\pi X V_0 \sin \omega t) \qquad (3)$$

where

P=intensity of the emergent light $P_0$=intensity of the incident light $V_\pi$=half wave voltage, i. e. voltage that causes the plane of polarization to rotate 90° in the sensor $V_0 \sin\omega t$=alternating voltage with the frequency $\omega$, ($V_0$ is the amplitude and t is the time) applied on the sensor element.

Crystals exhibiting the Pockels effect, e.g. $LiNbO_3$, $LiTaO_3$, KDP, ADP, and $Bi_4Ge_3O_{12}$ have been used as the material of the optical sensor. The alteration in the refractive index caused by the electric field depends on the crystal symmetry. For example, in the $Bi_4Ge_3O_{12}$ crystal having dimension d in the plane of the electric field and 1 in the direction of the light wave, [110]-oriented electric field causes a 180° phase difference between the [110] and [001]-oriented components of the plane polarized light if the voltage applied across the crystal is $$V_\pi = (\lambda/2 \; n_0^3 r_{41})(d/1), \qquad (4)$$

that causes the plane of the polarization to rotate 90°.

Figure 2:
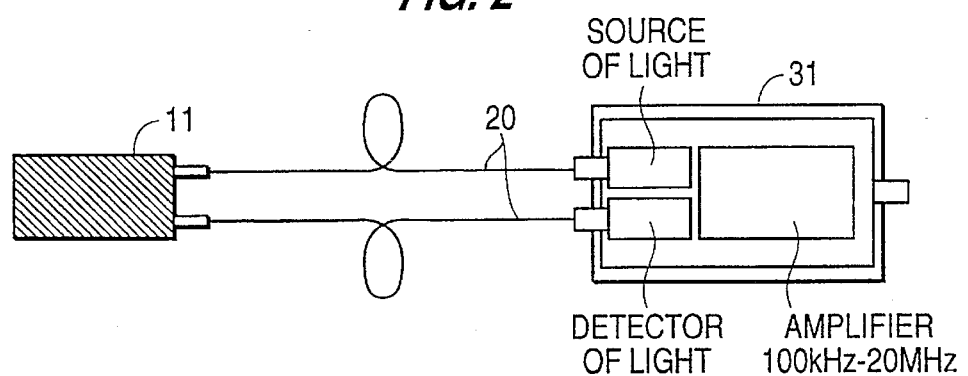
FIG. 2 is an alternative measurement system using a sensor in accordance with the invention.

According to FIG. 2, sensor 11 in an alternative measurement system has a prism for deviating the ray. A sensor of this kind is described in detail in FIGS. 10–11. In this figure general parts of the electronic unit 31 are represented: source of light emitting the light into optical fibres 20, detector of light that detects the light returned from sensor 11 through the optical fibres, and the amplifier for amplifying the detected signal. In high frequency embodiments the amplifier has to be able to function in a frequency range of, e.g., 10 MHz–30 MHz. With the sensors for high voltage tests an ability to function in the frequency range 20 Hz–30 MHz is required.

Figure 3:
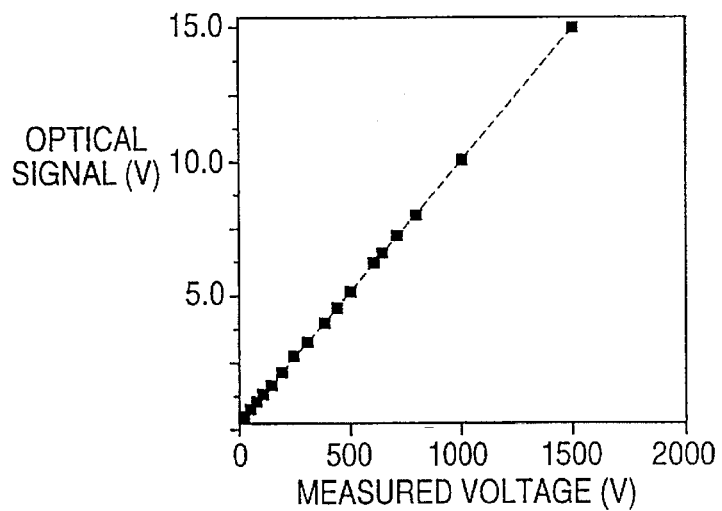
FIG. 3 represents the optical signal of the sensor in accordance with the invention in relation to the voltage being measured.

According to FIG. 3 the minimum measurable voltage level is determined by the characteristics of the sensor and the signal/noise ratio of the light detector and the amplifier. The maximum measurable voltage is determined by the breakdown endurance of the sensor. The crystal in the sensor is adjusted to provide in theory a linear functioning of the sensor up to 3 kV when voltage being measured is connected by wires directly to the conducting surfaces of the crystal. The figure shows the dependence of the light intensity passed through the sensor on the electric field being measured, when utilizing a $\lambda/4$-phase shift plate (where $\lambda$ is the wave length of the light), the working point is set on the linear part of the curve. The sensor output is nearly linear in relation to the voltage being measured, when the maximum voltage connected to the conductive surfaces of the crystal is $V_{max} \leq 1/6 \; V_{\lambda/2}$.

The estimated resolution of the whole measurement system was 0.5 V in the frequency range 30 Hz–100 kHz and 10 V in the frequency range 100 kHz–30 MHz, and the estimated accuracy was ±0.5/(30 Hz–100 kHz) and ±1.0/ (100 kHz–30 MHz).

According to FIG. 4 the basic components of the sensor in accordance with the invention listed in the sequence as passed by the light are polarizer 1, phase shift plate 2, crystal 3, and polarizer 4 acting as an analyzer. Crystal 3 applicable with the embodiment is oriented so that it enables the electric field being measured to produce the required alteration in plane of the plane polarized light traversing the crystal. Polarizers 1, 4 and optical shift plate 2 are oriented so that the change in the intensity of the light traversing the whole sensor is directly proportional to the voltage being measured.

Figure 5:
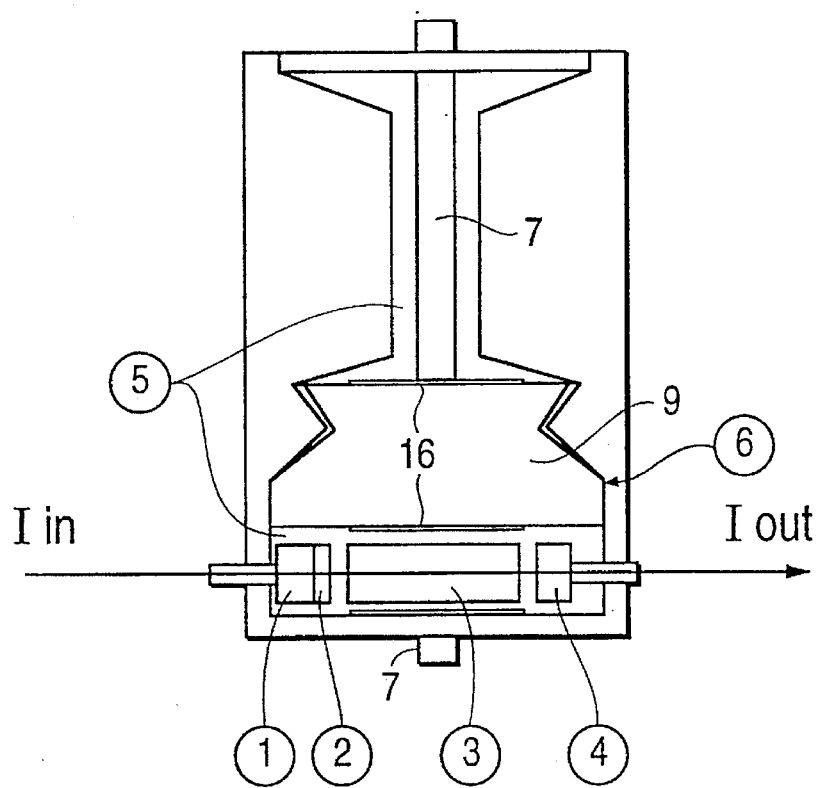
FIG. 5 is a sectional side view of a sensor in accordance with the invention.

In FIG. 5, the basic components are inserted into the actual sensor. In addition, for potential division, the sensor is provided with capacitor 6 and wire 7 to lead the measurement signal to crystal of the sensor 3. The inner space of the sensor is filled with silicone 5. As an insulating material 9 of capacitor 6 favourably ceramics or alternatively polypropylene is used. Conducting plates 16 of the capacitor 6 are formed onto the surface of ceramics 9. Particularly suitable ceramics for the invention is the commercial product Makor having a dielectric constant $\epsilon$ of 5.6. Using this embodiment a good voltage endurance and an appropriate resolution in high frequency applications is achieved.

The embodiment according to FIG. 6 utilizes a symmetrical potential dividing on both sides of crystal 3.

In the electric field sensor according to FIG. 7, no potential dividing capacitor is used, but the field is brought by wires 7 directly to the surface of crystal 3. The whole sensor structure is surrounded by two semispherical conductive covers 7 isolated from each other. The inner space of the sensor is filled with silicone 5.

The embodiment according to FIG. 8 corresponds to the embodiment shown in FIG. 5 accomplished without potential dividing capacitor 6. The field is brought by wires 7 to metallizations 14 that are made directly on the surface of crystal 3. The inner space of the sensor is filled with silicone. Mesurements demonstrated that due to using silicone, the voltage endurance of the sensor improved approximately five times.

Figure 9:
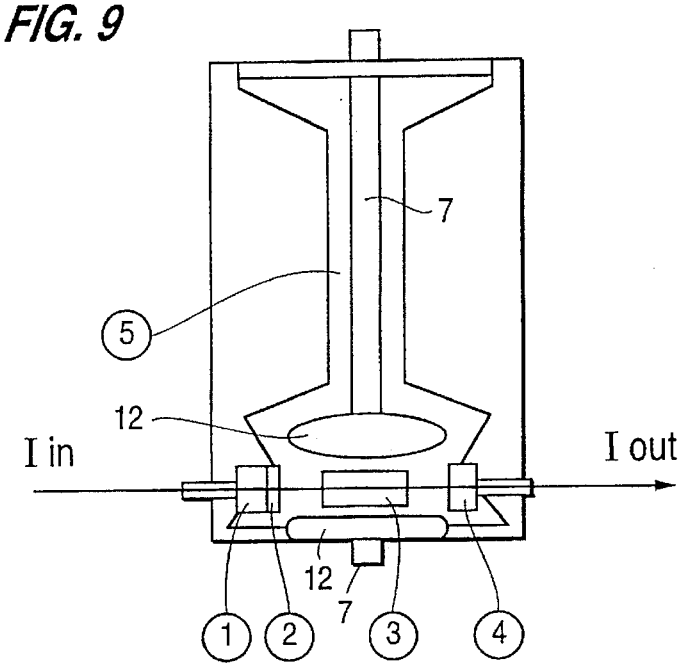
FIG. 9 is a sectional side view of a fourth sensor in accordance with the invention.

In the embodiment according to FIG. 9, the voltage being measured is brought by wires 7 to conductive ball or plate 12 that is situated at a distance from crystal 3. Because the inner structure is filled with silicone 5, the gap between plate 12 and crystal 3 acts as a potential divider. The electric field is confined within silicone, because silicone has a smaller dielectric constant than the crystal: $\epsilon=2.9<\epsilon_{crystal}=16$. Silicone 5 has a high voltage endurance and also its extinction coefficient is small, therefore silicone does not warm up even in an intensive high frequency electric field.

Figure 10:
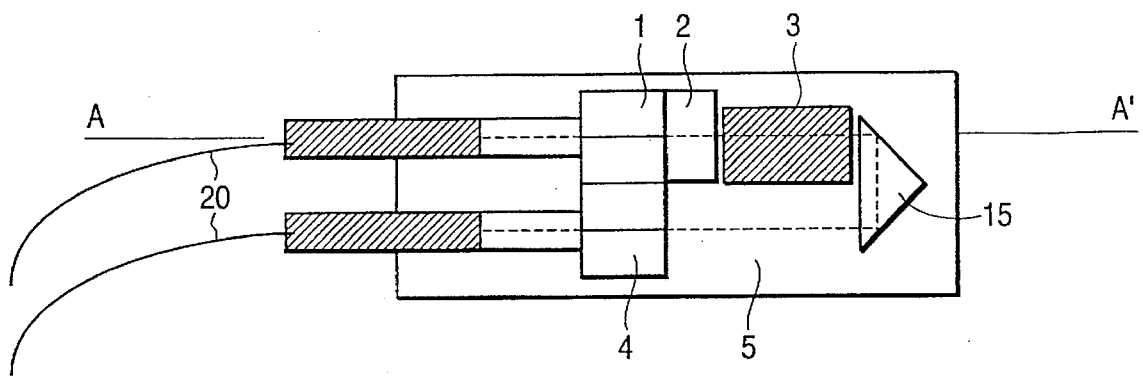
FIG. 10 is a sectional top view of a fifth sensor in accordance with the invention.
Figure 11:
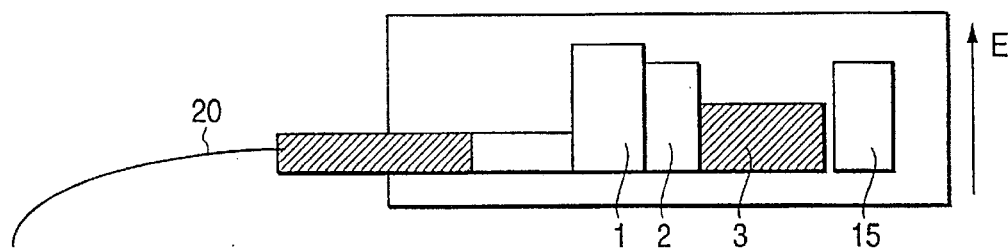
FIG. 11 is a sectional side view of the sensor illustrated in FIG. 10.

The sensor according to FIG. 10 and 11 corresponds by its basic components to the sensors shown in FIGS. 4–9. The main difference is the prism 15 that returns the light signal passed through crystal 3. As usually, there are polarizers 1 and 4 on the path of the light, and phase shift plate 2 is on the path between the first polarizer 1 and crystal 3.

In the following, the properties of the significant components of the invention are exemplified:

---

Crystal 3

---

$Bi_4Ge_3O_{12}$:

43 m-crystal symmetry; cubic,
Refractive index n = 2,0975 (633 nm)
Temperature dependence of refractive index
(dn/dT)/n = 2 · $10^{-5}$/K (633 nm)
Thermal coefficient of expansion (dH/dT)/h = 1 $10^{-6}$/K
$r_{41}$ = 0,95 · $10^{-12}$m/V
$n_0^3 r_{41}$ = 8,8 · $10^{-12}$m/V (631 nm)
Direction of the light path: [1–10]
Direction of the electric field: [110]
On both [110]-surfaces of the crystal a chrome/(gold) film was vaporized
Dimensions of the crystal 3 × 7 × 10 mm
Phase shift plate 2

λ/4-phase shift plate
Quartz
Diameter 5 mm
Thickness 3 mm or cube 3 × 3 × 3
Polarizers 1 and 4

Option 1 (the embodiment according to FIG. 10–11)
Polarization cube
Wave length: 830 nm
Size: A = B = C = 5 mm
Option 2 (the embodiment according to FIG. 4–9)
Polarization film
Wave length: 830 nm
Size: diameter 5 mm, thickness 1 mm.
Fibres 20:

Option 1 (FIG. 10–11)
Ensign Pickford: HCP-MO400T-10
Diameter of the core 400 μm
Uncabled
Option 2 (FIG. 4–9)
Ensign Pickford: HCP-MO200T-A02VZ-07
200/230 μm (core/coating)
Cabled; double cabled
Potential dividing capacitors ceramical material Makor or
polypropene or
teflon
diameter 40 mm, height 10–60 mm
Case Case material: cast plastic with resin filling, ceramics or teflon tube
The structure of the sensor was designed fully isolative
Fibres were attached to the case by means of ceramic ferrules.
The ferrules were designed specially for this embodiment
Selfoc microlenses were placed into glass ceramic cartridges
Components were placed into a v-groove
The crystal was designed so that its natural vibrations were quickly damped
On the surfaces of the crystals chrome/gold films were vaporized
As polarizers cube polarizers or film polarizers cut in an appropriate size and shape were used
Inner cavities of the sensors were filled with silicone (table 1)

In the following, a table is represented that illustrates properties of insulating material 9 (glass ceramics) and silicone 5, applicable for the invention.

TABLE 1

| Material | Glass ceramics (MACOR) | Silicone |
|---|---|---|
| Type | | Sylgard 527 |
| GENERAL PROPERTIES | | |
| density kg/m³ | 2520 | 970 |
| ELECTRICAL RESISTIVITY | | |
| ohm-cm | 1E + 14 | 2.3E + 15 |
| Extinction coefficient | 0.003 | 0.00015 |
| Dielectric constant | 5.9 | 2.95 |
| Voltage endurance kV/mm | 40 | 17 |
| HEAT | | |
| Thermal expansion ppm/K | 10 | 990 |
| Thermal conductivity W/mK | 1.68 | |
| Minimum temperature (C.) | | −65 |
| Maximum temperature (C.) | 1000 | 230 |
| MECHANICAL | | |
| Modulus of elasticity GN/m² | 65 | |
| Specific rigidity E/density | 2.60E + 07 | |
| OPTICAL | | |
| Refractive index | | n. 1.5 |

Instead of the infrared radiation mentioned in the examples above also other wavelengths can be used in the invention.

What is claimed is:

1. An optical voltage and electric field sensor based on the pockels effect comprising:

a crystal having a refractive index distribution which is altered when an electric field is applied to said crystal;

means for applying an electric field to said crystal;

a detector detecting changes in said refractive index distribution of said crystal; and a transparent material having an extinction coefficient and a dielectric constant which are less than an extinction coefficient and dielectric constant of said crystal, said transparent material surrounding said crystal including regions outside of an optical path through said crystal.

2. The sensor as claimed in claim 1, wherein said detector comprises:

a first polarizer aligned on a first side of said crystal;

a phase shift plate aligned on said first side of said crystal; and a second polarizer aligned on a second side of said crystal.

3. The sensor as claimed in claim 1, wherein said transparent material is silicone.

4. The sensor as claimed in claim 1, wherein said transparent material has a refractive index of approximately 1.5, an extinction coefficient of approximately 0.00015, and a dielectric constant of approximately 2.95.

5. The sensor as claimed in claim 1, further comprising optical fibers for routing light through said detector and said crystal.

6. The sensor as claimed in claim 1, wherein said means for applying an electric field comprise wires for leading an electric field onto a surface of said crystal.

7. The sensor as claimed in claim 6, wherein said wires are gappedly aligned near said crystal and said transparent material damps the voltage and electric field to be measured.

8. The sensor as claimed in claim 6, further comprising a capacitor inserted between at least one of said wires and said crystal.

9. The sensor as claimed in claim 8, wherein said capacitor comprises a first conducting plate connected to said at least one of said wires, a second conducting plate attached to a surface of said crystal, and insulating material between said first and second conducting plates.

10. The sensor as claimed in claim 6, further comprising a conductive cover surrounding said detector, said crystal, and said wires, space inside said conductive cover being filled with said transparent material.

11. The sensor as claimed in claim 6, wherein said wires are surrounded by said transparent material.

12. The sensor as claimed in claim 6, further comprising a first conductor spaced apart from a first side of said crystal and a second conductor spaced apart from a second side of said crystal, said wires contacting corresponding said first and second conductors, and space between said first and second conductors and said crystal being filled with said transparent material.

13. The sensor as claimed in claim 12, further comprising a third conductor attached to said first side of said crystal and a fourth conductor attached to said second side of said crystal.

14. The sensor as claimed in claim 6, wherein said wires directly contact said crystal.

15. A method of sensing voltages and electric fields comprising:

surrounding a crystal, including regions outside of an optical path through said crystal, having a refractive index distribution which is altered when an electric field is applied with a transparent material having an extinction coefficient and a dielectric constant which are respectively less than an extinction coefficient and a dielectric or constant of said crystal;

applying an electric field to be measured to said crystal;

delivering light to said crystal; and determining the electric field applied to said crystal from said light output from said crystal.

* * * * *